(12) United States Patent
Tagashira

(10) Patent No.: US 12,114,417 B2
(45) Date of Patent: Oct. 8, 2024

(54) CIRCUIT BOARD

(71) Applicant: SUMITOMO BAKELITE CO., LTD., Tokyo (JP)

(72) Inventor: Nobuo Tagashira, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 214 days.

(21) Appl. No.: 17/912,989

(22) PCT Filed: Feb. 19, 2021

(86) PCT No.: PCT/JP2021/006292
§ 371 (c)(1),
(2) Date: Sep. 20, 2022

(87) PCT Pub. No.: WO2021/192755
PCT Pub. Date: Sep. 30, 2021

(65) Prior Publication Data
US 2023/0156905 A1 May 18, 2023

(30) Foreign Application Priority Data
Mar. 23, 2020 (JP) ................................. 2020-050891

(51) Int. Cl.
*H05K 1/02* (2006.01)
*H05K 1/09* (2006.01)

(52) U.S. Cl.
CPC ............. *H05K 1/0209* (2013.01); *H05K 1/09* (2013.01); *H05K 2201/0355* (2013.01)

(58) Field of Classification Search
CPC ......... H05K 1/0209; H05K 2201/0355; H05K 2201/09154; H05K 2201/09272; H05K 2201/09281
See application file for complete search history.

(56) References Cited

U.S. PATENT DOCUMENTS 9,012,783 B2  4/2015 Abe et al.
9,055,676 B2  6/2015 Watanabe
(Continued)

FOREIGN PATENT DOCUMENTS

EP  2436475 A1  4/2012
JP  5-51271 A   3/1993
(Continued)

OTHER PUBLICATIONS

International Search Report dated May 11, 2021, issued in counterpart International Application No. PCT/JP2021/006292 (2 pages).
(Continued)

*Primary Examiner* — Sherman Ng
(74) *Attorney, Agent, or Firm* — WHDA, LLP

(57) ABSTRACT

A heat radiating substrate (10) includes an insulating layer (11) and a circuit pattern (20) of a metal formed on the insulating layer (11) in direct contact with the insulating layer (11), in which a side surface (that is, metal layer side surface (23)) of the circuit pattern (20) has a region in which an angle θ formed by a surface (insulating layer upper surface (11a)) of the insulating layer (11) (insulating substrate) and a tangential line L at a middle portion (X1) in a height direction in a cross-sectional view perpendicular to an extending direction of the metal is 80 degrees or more and 100 degrees or less.

5 Claims, 5 Drawing Sheets

(56) References Cited

U.S. PATENT DOCUMENTS

| | | | |
|---|---|---|---|
| 10,818,565 B2 | 10/2020 | Kato et al. | |
| 10,861,769 B2 | 12/2020 | Iwasaki et al. | |
| 2012/0080216 A1 | 4/2012 | Abe et al. | |
| 2013/0161077 A1 | 6/2013 | Watanabe | |
| 2015/0267305 A1* | 9/2015 | Choi | H01L 21/30604 |
| | | | 216/13 |
| 2018/0057412 A1* | 3/2018 | Kato | H01L 23/13 |
| 2019/0172765 A1 | 6/2019 | Kato et al. | |
| 2019/0371690 A1* | 12/2019 | Iwasaki | H01L 24/83 |
| 2019/0371701 A1 | 12/2019 | Iwasaki et al. | |

FOREIGN PATENT DOCUMENTS

| | | |
|---|---|---|
| JP | 2009-272647 A | 11/2009 |
| JP | 2011-216619 A | 10/2011 |
| JP | 2012-49462 A | 3/2012 |
| JP | 2013-161925 A | 8/2013 |
| JP | 2016-82108 A | 5/2016 |
| JP | 2018-147934 A | 9/2018 |
| WO | 2018/021473 A1 | 2/2018 |
| WO | 2018/154692 A1 | 8/2018 |

OTHER PUBLICATIONS

Notice of Reasons for Refusal dated Aug. 31, 2021, issued in counterpart JP Patent Application No. 2021-538463, w/English translation (10 pages).

Notice of Reasons for Refusal dated Dec. 21, 2021, issued in counterpart JP Patent Application No. 2021-538463, w/English translation (9 pages).

Decision to Grant a Patent dated Mar. 1, 2022, issued in counterpart JP Patent Application No. 2021-538463, w/English translation (7 pages).

Extended (Supplementary) European Search Report dated May 22, 2024, issued in counterpart EP application No. 21775474.6. (8 pages).

* cited by examiner

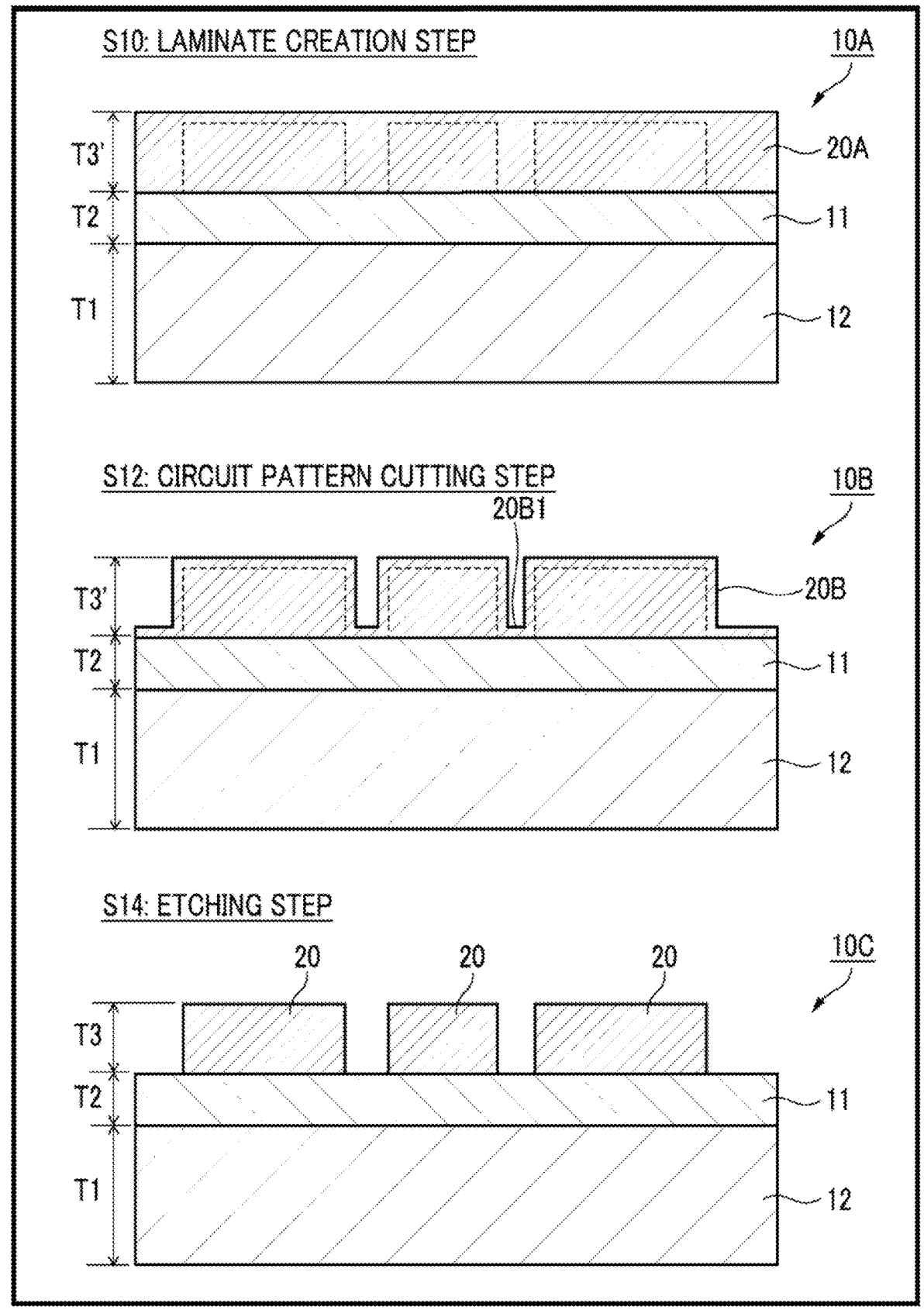

CIRCUIT BOARD

TECHNICAL FIELD

The present invention relates to a circuit board.

BACKGROUND ART

In recent years, the market for a power module on which an IGBT element and the like are mounted has been expanding. The power module is required to have high reliability and high heat resistance. As this kind of technique, various developments have been made so far in circuit boards (also referred to as heat radiating substrates) having a heat radiation function. As this kind of technique, for example, a technique disclosed in Patent Document 1 is known. Patent Document 1 discloses a power module in which a semiconductor element is mounted on a support, such as a lead frame, and the support and a heat radiating plate connected to a heat sink are bonded with an insulating resin layer.

RELATED DOCUMENT

Patent Document

[Patent Document 1] Japanese Unexamined Patent Publication No. 2011-216619

SUMMARY OF THE INVENTION

Technical Problem

In recent years, better heat radiation properties are required for such a circuit board. The technique disclosed in Patent Document 1 cannot sufficiently satisfy the requirement of the heat radiation function for the power module.

The present invention has been made in view of such a situation, and an object of the present invention is to provide a technique of enhancing heat radiation properties in a circuit board having a heat radiation function.

Solution to Problem

According to the Present Invention,
it is possible to provide a circuit board including:
an insulating substrate; and
a circuit pattern of a metal formed on the insulating substrate in direct contact with the insulating substrate,
in which a side surface of the circuit pattern has a region in which an angle formed by a surface of the insulating substrate and a tangential line at a middle portion in a height direction in a cross-sectional view perpendicular to an extending direction of the metal is 80 degrees or more and 100 degrees or less.

Advantageous Effects of Invention

According to the present invention, it is possible to provide a technique of enhancing heat radiation properties in a circuit board having a heat radiation function.

BRIEF DESCRIPTION OF THE DRAWINGS

FIG. 6 is a chart showing a production step of the heat radiating substrate according to the embodiment.

DESCRIPTION OF EMBODIMENTS

Hereinafter, an embodiment of the present invention will be described with reference to the drawings.

<Overview of Heat Radiating Substrate>

Figure 1:
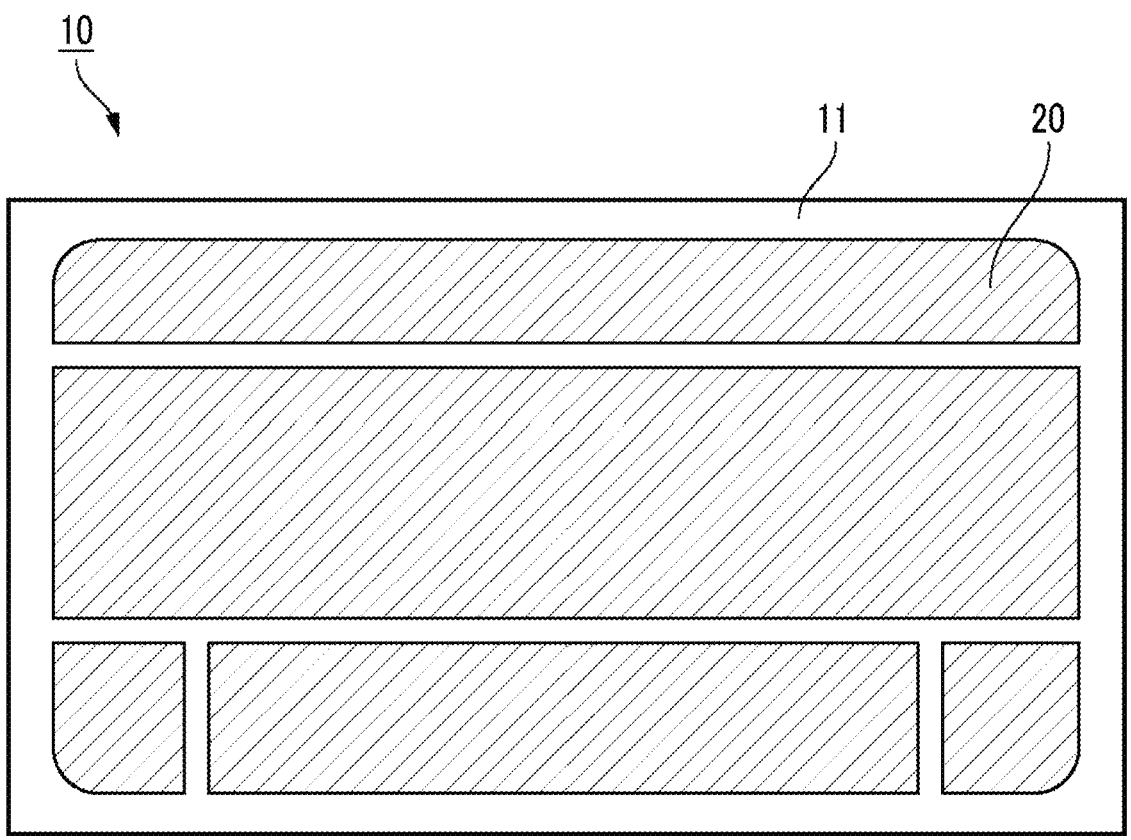
FIG. 1 is a plan view of a heat radiating substrate according to an embodiment.
Figure 2:
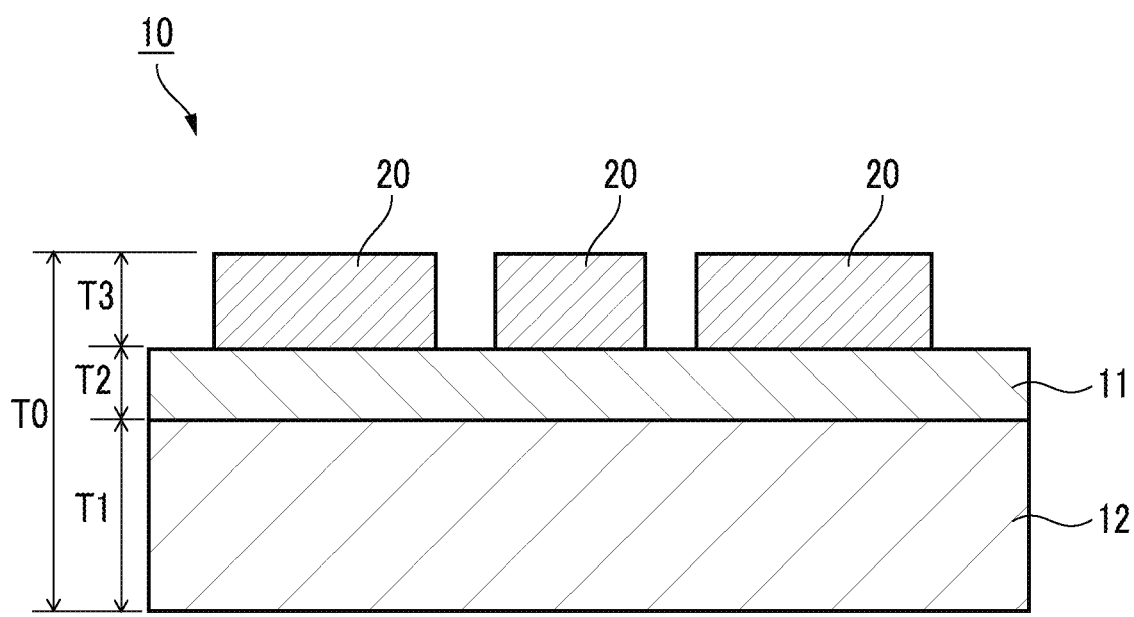
FIG. 2 is a cross-sectional view of the heat radiating substrate according to the embodiment.

FIG. 1 is a plan view of a heat radiating substrate 10. FIG. 2 is a cross-sectional view of a part of the heat radiating substrate 10.

The heat radiating substrate 10 is a circuit board on which an electronic component of a heat-generating body and the like are mounted, is composed of a metal substrate 12, an insulating layer 11, and a circuit pattern 20, and is a laminate (laminated body) laminated in this order from the bottom as shown in FIG. 2. Electronic components and the like are mounted on the circuit pattern 20.

The total thickness T0 of the heat radiating substrate 10 is not particularly limited, but is, for example, preferably 300 μm or more and 5000 μm or less and more preferably 1000 μm or more and 4000 μm or less.

<Metal Substrate 12>

The metal substrate 12 is a layer composed of a metal material, and in the present embodiment, the insulating layer 11 is formed on an upper surface thereof, and a heat radiating means (not shown), such as heat radiating fins and radiators, is appropriately attached to the lower surface thereof.

The metal material constituting the metal substrate 12 is not limited to a specific type, but for example, copper, a copper alloy, aluminum, an aluminum alloy, or the like can be used.

The thickness T1 of the metal substrate 12 is not particularly limited, but is the thickest among the elements (the insulating layer 11, the metal substrate 12, and the circuit pattern 20) laminated in the heat radiating substrate 10, and is preferably 10% to 90% with respect to the total thickness T0.

The upper limit value of the thickness T1 of the metal substrate 12 is, for example, 20.0 mm or less and preferably 5.0 mm or less. The metal substrate 12 having the thickness T1 equal to or less than the upper limit value is used, so that the heat radiating substrate 10 as a whole can be made thinner. Further, it is possible to improve the workability in routing, cutting, or the like of the heat radiating substrate 10.

The lower limit value of the thickness T1 of the metal substrate 12 is, for example, 0.1 mm or more, preferably 0.5 mm or more, and more preferably 1.0 mm or more. The metal substrate 12 having the lower limit value or more is used, so that the heat radiation properties of the heat radiating substrate 10 as a whole can be improved.

<Insulating Layer 11>

The insulating layer 11 is a layer of a resin substrate mainly composed of a resin material, and has a function of insulating the metal substrate 12 from the circuit pattern 20. As the insulating layer 11, a ceramic substrate (an aluminum nitride substrate, a silicon nitride substrate, or the like) may be used instead of the resin substrate.

The resin material constituting the insulating layer 11 is not limited to a specific type, but examples thereof include a thermosetting resin, such as an epoxy resin, a phenol resin, a urea resin, a melamine resin, a polyester (unsaturated polyester) resin, or a polyimide resin, a silicone resin, and a polyurethane resin. As the resin material, one or a mixture of two or more of these resins can be used.

A filler composed of particles having electrical insulation properties and high thermal conductivity can also be mixed into the resin material constituting the insulating layer 11. Examples of the constituent material of the particles of the filler include metal oxides, such as alumina, and nitrides, such as boron nitride.

The thickness T2 of the insulating layer 11 is appropriately set according to the purpose, but the thickness T2 of the insulating layer 11 is preferably 40 µm or more and 400 µm or less from the viewpoint of more effectively transferring heat from the electronic component to the metal substrate 12 while improving the mechanical strength and heat resistance, and it is more preferable that the thickness T2 of the insulating layer 11 is set to 80 µm or more and 300 µm or less from the viewpoint of further excellent balance between the heat radiation properties and the insulation properties in the entire heat radiating substrate 10. The thickness T2 of the insulating layer 11 is set to the above upper limit value or less, so that it is possible to facilitate the transfer of heat from the electronic component to the metal substrate 12. In addition, the thickness T2 of the insulating layer 11 is set to the above lower limit value or more, so that the insulating layer 11 can sufficiently alleviate the generation of thermal stress caused by a difference in coefficient of thermal expansion between the metal substrate 12 and the insulating layer 11. Further, the insulation properties of the heat radiating substrate 10 are improved.

<Circuit Pattern 20>

The circuit pattern 20 is composed of a conductive metal material, and is electrically connected to an electronic component (LED or the like) of a heat-generating body by, for example, soldering. For example, copper can be suitably used as the metal material constituting the circuit pattern 20. With this, the circuit pattern 20 has a relatively small resistance value. The circuit pattern 20 may be at least partially covered with a solder resist layer.

Figure 7A:
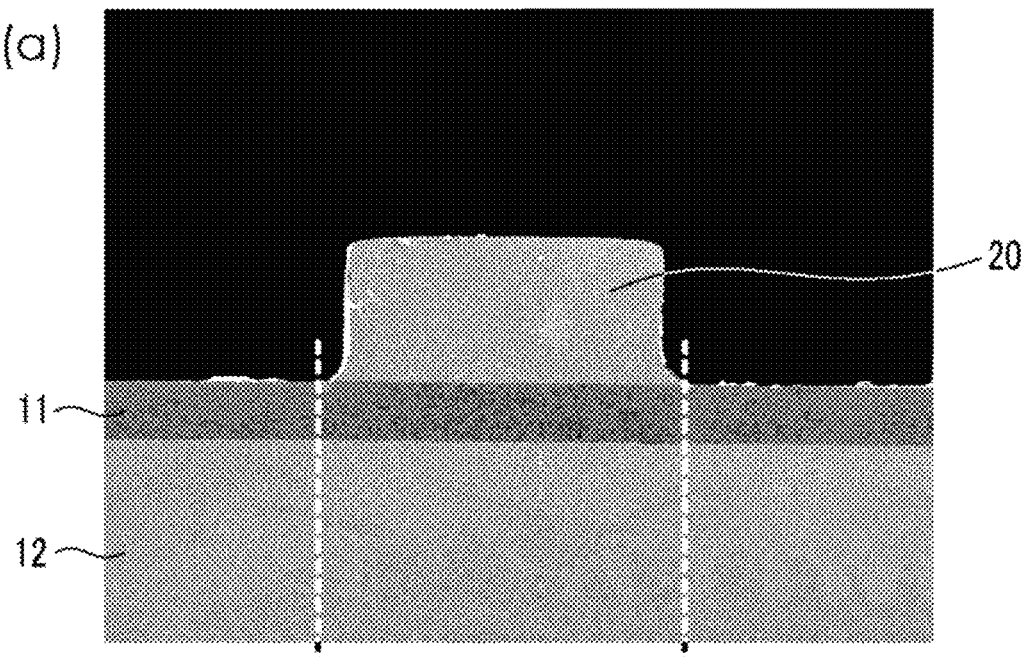
FIG. 7($a$) and FIG. 7($b$) are a view showing a cross-sectional structure of the circuit pattern according to the embodiment so as to be comparable with a conventional structure.
Figure 7B:
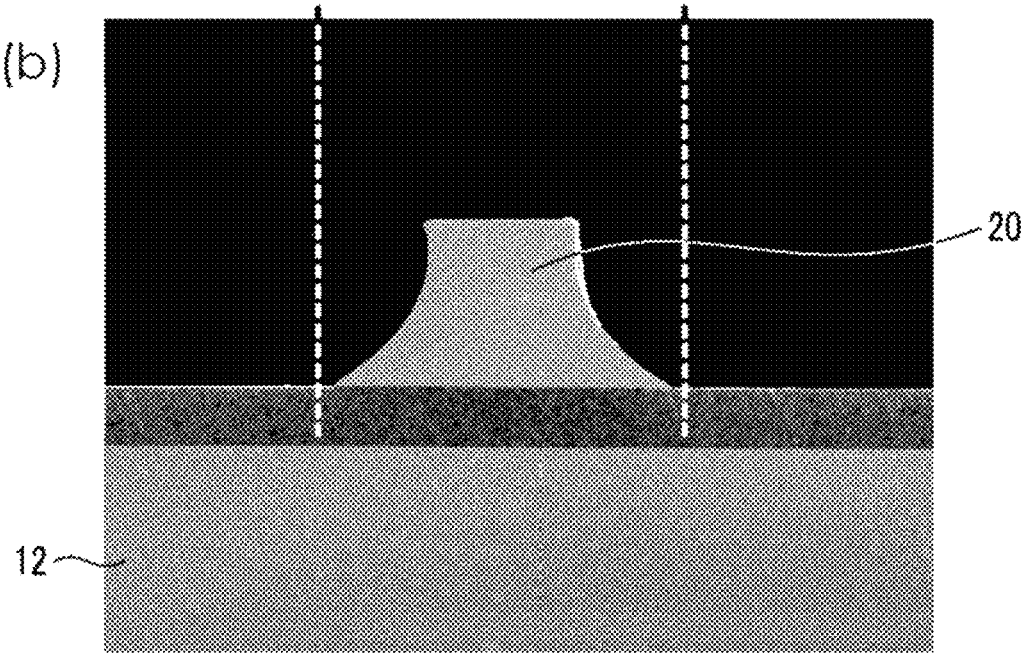

The circuit pattern 20 is formed, for example, by working a metal layer laminated on an insulating layer upper surface 11a of the insulating layer 11 into a predetermined pattern through cutting and etching. The formation process will be described later in FIG. 7(a) and FIG. 7(b), but in the present embodiment, rolled copper is used as a metal layer 20A in FIG. 7(a) and FIG. 7(b).

The lower limit value of the thickness T3 of the circuit pattern 20 is, for example, 0.3 mm or more. In a case where the lower limit value is such a numerical value or more, it is possible to restrain the circuit pattern from generating heat even in a use requiring a high current. The upper limit value of the thickness T3 of the circuit pattern 20 is, for example, 5.0 mm or less, preferably 4.0 mm or less, and more preferably 3.0 mm or less. In a case where the upper limit value is such a numerical value, the circuit workability can be improved, and the substrate as a whole can be made thinner.

<Specific Shape of Circuit Pattern 20>

A specific shape of the circuit pattern 20, particularly a cross-sectional shape, will be described with reference to FIGS. 3 to 5.

Figure 3:
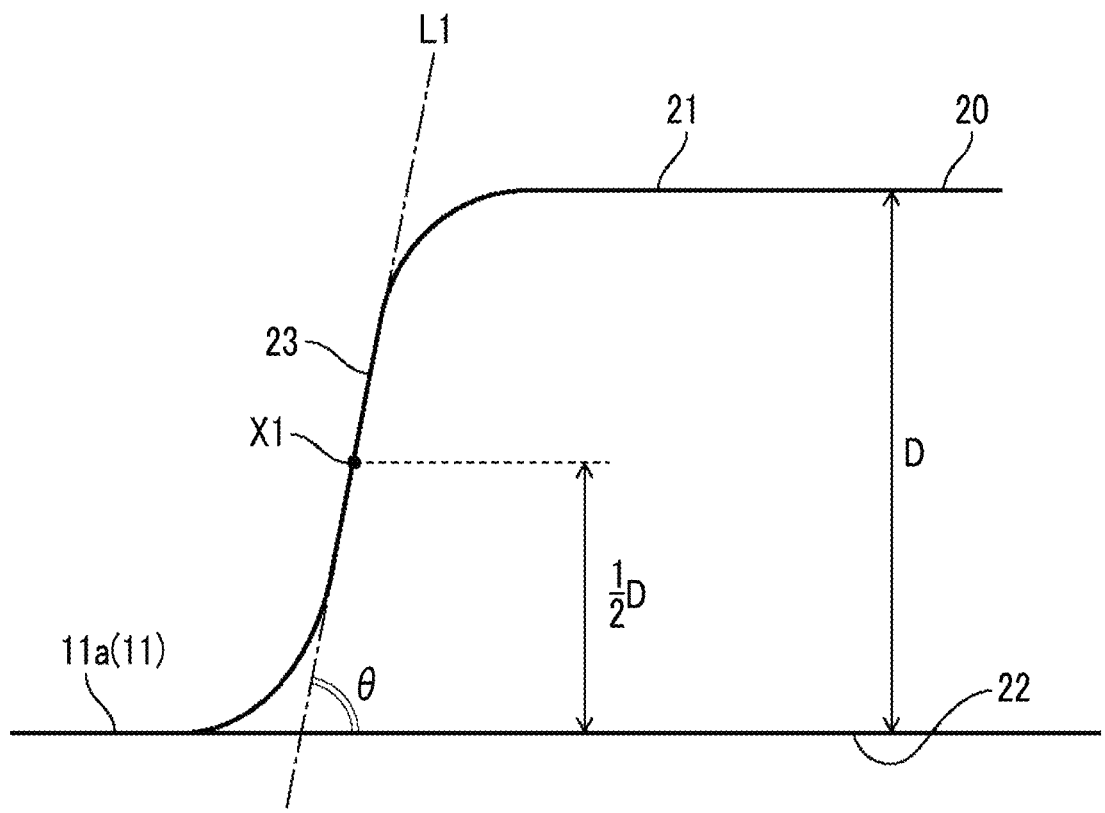
FIG. 3 is an enlarged view showing a circuit pattern for a cross-sectional structure of the heat radiating substrate according to the embodiment.

FIG. 3 is a view showing a cross-sectional structure of the circuit pattern 20, and is shown here without hatching. This is a structure showing a cross-sectional view perpendicular to the extending direction of the metal material constituting the circuit pattern 20.

As shown in FIG. 3, the circuit pattern 20 is formed on the insulating layer upper surface 11a of the insulating layer 11. Here, the height (that is, the distance to a metal layer upper surface 21 from a metal layer lower surface 22 which is an interface with the insulating layer upper surface 11a) of the circuit pattern 20 is denoted by D. At this time, in a metal layer side surface 23, in a case where an angle formed by a surface (that is, the insulating layer upper surface 11a) of the insulating layer 11 and a tangential line L1 at a position X1 of the middle portion (height of 0.5D) in the height direction is denoted by θ (hereinafter, referred to as "inclination angle θ", a region in which the inclination angle θ is 80 degrees or more and 100 degrees or less is provided. That is, the metal layer side surface 23 of the circuit pattern 20 has a region that is formed substantially perpendicularly at the position X1 of the middle portion in the height direction.

A specific shape of the circuit pattern 20 will be described with reference to FIG. 4. Here, the shape of the metal layer side surface 23 will be particularly described. FIG. 4 shows the cross-sectional structure of the same cross-sectional view as that of FIG. 3.

Figure 4:
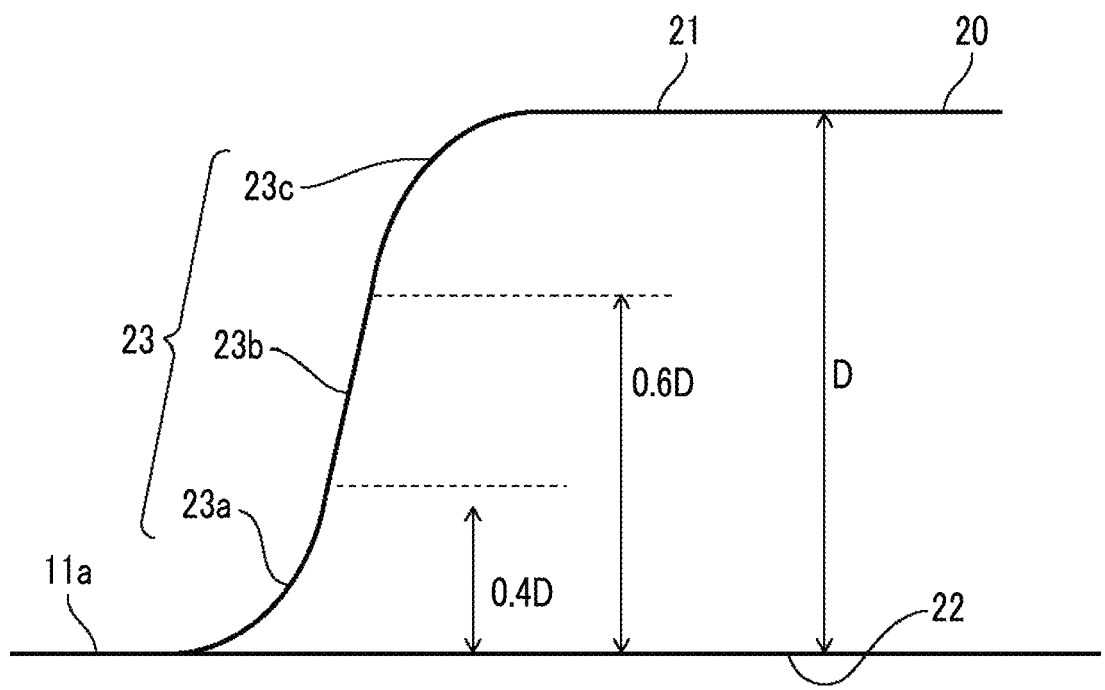
FIG. 4 is an enlarged view showing the circuit pattern for the cross-sectional structure of the heat radiating substrate according to the embodiment.
Figure 5:
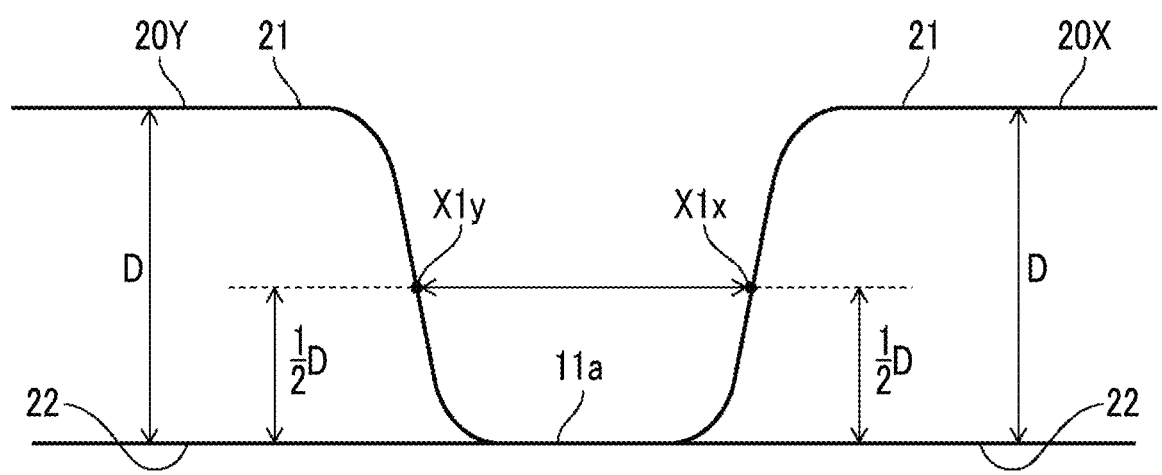
FIG. 5 is an enlarged view showing the circuit pattern for the cross-sectional structure of the heat radiating substrate according to the embodiment.

In the cross-sectional view shown in FIG. 4, the metal layer side surface 23 has a trailing-tailed part 23a, a straight line part 23b, and a rounded part 23c in this order from the lower side to the upper side.

The trailing-tailed part 23a has a structure formed in a boundary region (a region from the interface to a predetermined height) with the insulating layer 11, and has a trailing-tailed shape in which a surface becomes gentler (a gentle curve in the cross-section) toward the insulating layer upper surface 11a side. The position where the trailing-tailed part 23a is formed is, for example, a region to the position of 0.4D in the perpendicular direction from the insulating layer upper surface 11a of the insulating layer 11, and is a region preferably to the position of 0.3D and more preferably to the position of 0.2D therefrom.

The straight line part 23b is, for example, a region that is continuously formed in a straight line having the above inclination angle θ with a surface roughness equal to or less than an average roughness of the surface in the cross-section. The straight line part 23b is formed in a range from the position of 0.4D to the position of 0.6D in the perpendicular direction from the insulating layer upper surface 11a of the insulating layer 11. The straight line part 23b is formed in a range preferably from the position of 0.3D to the position of 0.7D and more preferably from the position of 0.2D to the position of 0.8D. The straight line part 23b can also be said to be a region (that is, a perpendicular part) in which the tangential line of the region is formed substantially perpendicularly at the above-described inclination angle θ (for example, 80 degrees or more and 100 degrees or less).

The rounded part 23c is a region connected to the metal layer upper surface 21 of the circuit pattern 20, and exhibits a curved surface that becomes gentler toward the metal layer upper surface 21 side. The rounded part 23c is formed in a range to the boundary with the metal layer upper surface 21 from the position of 0.6D in the perpendicular direction from the insulating layer upper surface 11a of the insulating layer 11. The rounded part 23c is formed in a range to the boundary with the metal layer upper surface 21 (the position of the height D) preferably from the position of 0.7D and more preferably from the position of 0.8D.

The intervals between adjacent circuit patterns 20X and 20Y will be described with reference to FIG. 5. The circuit patterns 20X and 20Y shown here satisfy the conditions of the circuit pattern 20 illustrated in FIG. 4.

Here, the height D of each of the circuit patterns 20X and 20Y is denoted by b. Further, in the metal layer side surface 23 of the circuit pattern 20X, the position of the middle portion (height of 0.5D) in the height direction is denoted by X1x. Similarly, in the metal layer side surface 23 of the circuit pattern 20Y, the position of the middle portion (height of 0.5D) in the height direction is denoted by X1y. The distance between the positions X1x and X1y of respective middle portions (that is, the width between patterns at the middle portion in the height direction) is denoted by a. In this condition, a region in which the aspect ratio b/a is 0.2 or more and 5 or less is provided. In other words, the region is a region in which the height D (b) is relatively high with respect to the distance between the patterns.

<Summary of Features of Heat Radiating Substrate 10>

As described above, in the metal layer side surface 23, the trailing-tailed part 23a is provided to a height of 0.4D, and the straight line part 23b that is formed substantially perpendicularly from the position of a height of 0.4D to the position of a height of 0.6D is provided. That is, since the region of the trailing-tailed part 23a is small, a sufficient interval between the circuit patterns can be secured in the insulating layer upper surface 11a even in a case where the distance a between the positions X1x and X1y of the middle portions of the heights of the circuit patterns 20X and 20Y or the distance between the boundary portions in the metal layer upper surface 21 is narrowed. In other words, the circuit patterns 20X and 20Y can be made dense.

<Method of Producing Heat Radiating Substrate 10>

FIG. 6 is a chart showing the production process of the heat radiating substrate 10. A method of producing the heat radiating substrate 10 will be described with reference to FIG. 6.

(S10: Laminated Body Preparation Step)

A laminate 10A in which the metal substrate 12, the insulating layer 11, and the metal layer 20A are laminated in this order from the bottom is prepared. The metal layer 20A is worked by the following steps to form the circuit pattern 20.

As the method of producing the laminate 10A, a known method can be used. For example, the metal substrate 12 is used as a carrier, and a liquid material (varnish-like material) as a constituent material of the insulating layer 11 is applied onto the metal substrate 12 having the thickness T1 by, for example, a spray method.

Then, the liquid material applied on the metal substrate 12 is dried by natural drying or forced drying. With this, the insulating layer 11 having the thickness T2 is obtained. At this time, the insulating layer 11 may not be completely cured (so-called B stage state).

Next, the metal layer 20A having a thickness T3' is formed on the insulating layer 11. That is, the metal layer 20A to be the circuit pattern 20, for example, rolled copper is laminated on the insulating layer upper surface 11a of the insulating layer 11 by a hot press or the like. With this, the laminate 10A is obtained. The thickness T3' of the metal layer 20A is set in consideration of an etching step, which will be described later.

(S12: Circuit Pattern Cutting Step)

Subsequently, the metal layer 20A of the above-described laminate 10A is cut so as to have a desired pattern by using a router. A provisional circuit pattern 20B is formed on the insulating layer 11 by leaving a metal layer (thin copper portion 20B1) having a predetermined thickness for a portion that is not a pattern. That is, there is a concern that the insulating layer 11 may be damaged in a case where all the patterns are formed by cutting. Therefore, the metal layer (thin copper portion 20B1) having a thickness is partially left as a margin. With this, a laminate 10B having the provisional circuit pattern 20B is obtained.

(S14: Etching Step)

Subsequently, the etching process is performed on the laminate 10B having the provisional circuit pattern 20B to melt the remaining metal layer (thin copper portion 20B1) and to form a desired pattern so that the final circuit pattern 20 can be obtained. With this, the heat radiating substrate 10 is obtained.

Effect of Embodiment

The features and effects of the embodiment are summarized as follows.

(1) The heat radiating substrate 10 includes:
the insulating layer 11 (insulating substrate); and
the circuit pattern 20 of the metal formed on the insulating layer 11 in direct contact with the insulating layer 11,
in which the side surface (that is, the metal layer side surface 23) of the circuit pattern 20 has a region in which the inclination angle θ formed by the surface (insulating layer upper surface 11a) of the insulating layer 11 (insulating substrate) and a tangential line L at the middle portion (X1) in the height direction in a cross-sectional view perpendicular to the extending direction of the metal is preferably 80 degrees or more and 100 degrees or less.

With this, the circuit pattern 20 can be made dense.

(2) In the heat radiating substrate 10, the insulating layer 11 (insulating substrate) is a resin substrate.

(3) In the heat radiating substrate 10, the metal of the circuit pattern 20 is rolled copper.

It is possible to form the metal layer 20A of rolled copper provided on the insulating layer 11 into the desired circuit pattern 20 by efficiently working the metal layer 20A through cutting and etching.

(4) In the heat radiating substrate 10, in a case where the height of the circuit pattern 20 is denoted by D, the metal layer side surface 23 of the circuit pattern 20 exhibits a straight line in the cross-sectional view (for example, in the cross-sectional structure in FIG. 4) perpendicular to the extending direction of the metal, in a height range of 0.4D or more and 0.6D or less in the perpendicular direction from the insulating layer 11 (the insulating layer upper surface 11a). That is, since the straight line part 23b that can be regarded as substantially perpendicular is provided in the height range of 0.4D or more and 0.6D or less in the perpendicular direction from the insulating layer upper surface 11a, it is possible to form a circuit pattern 20 having good occupancy efficiency.

(5) The metal layer side surface 23 of the circuit pattern 20 exhibits a trailing-tailed shape at the interface with the insulating layer 11. That is, the trailing-tailed part 23a is provided in the vicinity of the metal layer lower surface 22, more specifically, in the range from the insulating layer upper surface 11a to a height of 0.4D.

With such a trailing-tailed shape, it is possible to make the circuit pattern 20 dense while realizing the desired adhesiveness of the circuit pattern 20 to the insulating layer 11.

(6) In a case where the height D of the circuit pattern 20 is denoted by b and the distance (distance from X1x to X1y) from the adjacent circuit pattern in the middle portions X1x and X1y of the height of the circuit pattern 20 is denoted by a, a region in which an aspect ratio b/a is 0.2 or more and 5 or less is provided. In this way, the region has the configuration in which the aspect ratio b/a is 0.2 or more and 5 or less, that is, the configuration in which the distance a between the circuit patterns 20 is narrowed with respect to the thickness T3 (height D=b) of the circuit pattern 20, so that the circuit pattern 20 can be made dense.

Although the embodiment of the present invention has been described above, the embodiment is examples of the present invention, and various configurations other than the above embodiment can be adopted.

Examples

FIG. 7(*a*) and FIG. 7(*b*) show photographs of cross-sectional structures of Example and Comparative Example. FIG. 7(*a*) is the heat radiating substrate 10 produced by forming the circuit pattern 20 by using the cutting and etching shown in the above-described embodiment (Example). FIG. 7(*b*) is a heat radiating substrate produced by forming the circuit pattern 20 by using only conventional general etching (Comparative Example). Here, the photographs of the circuit cross-sections are arranged side by side up and down so as to be comparable with each other. In these photographs, the width of the circuit pattern 20, more specifically, the width of the metal layer lower surface 22 (the interface with the insulating layer 11) is formed to be 1 mm.

In Comparative Example shown in FIG. 7(*b*), the side surface portion has a trailing-tailed shape (substantially Mt. Fuji shape) as a whole, and the area of the upper surface of the circuit pattern 20 is narrowed. On the other hand, in Example shown in FIG. 7(*a*), the region of the side surface portion with the trailing-tailed shape (trailing-tailed part 23*a* in FIG. 3) is small, and most of the region forms a straight line (straight line part 23*b* in FIG. 3). Therefore, as described above, it is possible to make the circuit pattern 20 dense as compared with the related art.

This application claims priority based on Japanese Patent Application No. 2020-050891 filed on Mar. 23, 2020, all of its disclosures are incorporated herein.

REFERENCE SIGNS LIST

10: heat radiating substrate
10A, 10B: laminate
10B: laminate
11: insulating layer
11*a*: insulating layer upper surface
12: metal substrate
20, 20X, 20Y: circuit pattern
20A: metal layer
20B: provisional circuit pattern
20B1: thin copper portion
21: metal layer upper surface
22: metal layer lower surface
23: metal layer side surface
23*a*: trailing-tailed part
23*b*: straight line part
23*c*: rounded part

The invention claimed is:

1. A circuit board comprising:
an insulating substrate; and
a circuit pattern of a metal formed on the insulating substrate in direct contact with the insulating substrate,
wherein a side surface of the circuit pattern has a region in which an angle formed by a surface of the insulating substrate and a tangential line at a middle portion in a height direction in a cross-sectional view perpendicular to an extending direction of the metal is 80 degrees or more and 100 degrees or less,
wherein in a case where a height of the circuit pattern is denoted by D, the side surface of the circuit pattern exhibits a straight line in the cross-sectional view perpendicular to the extending direction of the metal, in a height range of 0.4D or more and 0.6D or less in a perpendicular direction from the insulating substrate, and
wherein the side surface of the circuit pattern exhibits a trailing-tailed shape at an interface with the insulating substrate.

2. The circuit board according to claim 1,
wherein the insulating substrate is configured to be a resin substrate.

3. The circuit board according to claim 1,
wherein the metal is configured to be rolled copper.

4. The circuit board according to claim 1,
wherein in a case where a height of the circuit pattern is denoted by b and a distance from an adjacent circuit pattern in a middle portion of the height of the circuit pattern is denoted by a, a region in which an aspect ratio b/a is 0.2 or more and 5 or less is provided.

5. A circuit board comprising:
an insulating substrate; and
a circuit pattern of a metal formed on the insulating substrate in direct contact with the insulating substrate,
wherein a side surface of the circuit pattern has a region in which an angle formed by a surface of the insulating substrate and a tangential line at a middle portion in a height direction in a cross-sectional view perpendicular to an extending direction of the metal is 80 degrees or more and 100 degrees or less,
wherein the side surface of the circuit pattern exhibits a trailing-tailed shape at an interface with the insulating substrate, and
wherein in a case where a height of the circuit pattern is denoted by b and a distance from an adjacent circuit pattern in a middle portion of the height of the circuit pattern is denoted by a, a region in which an aspect ratio b/a is 0.2 or more and 5 or less is provided.

* * * * *